(12) United States Patent
Powell

(10) Patent No.: US 6,323,581 B1
(45) Date of Patent: Nov. 27, 2001

(54) LOW COMPONENT COUNT RELEASE MECHANISM

(75) Inventor: Simon Powell, Baldock (GB)

(73) Assignee: Greenbrook Electrical PLC, Essex (GB)

(*) Notice: Subject to any disclaimer, the term of this patent is extended or adjusted under 35 U.S.C. 154(b) by 0 days.

(21) Appl. No.: 09/380,572

(22) PCT Filed: Mar. 6, 1998

(86) PCT No.: PCT/GB98/00670

§ 371 Date: Oct. 22, 1999

§ 102(e) Date: Oct. 22, 1999

(87) PCT Pub. No.: WO98/40917

PCT Pub. Date: Sep. 17, 1998

(30) Foreign Application Priority Data

Mar. 7, 1997 (GB) .................................. 9704769

(51) Int. Cl.[7] .................................................. H01L 41/04
(52) U.S. Cl. .......................................... 310/328; 310/330
(58) Field of Search ............................... 310/328, 330, 310/331, 332

(56) References Cited

U.S. PATENT DOCUMENTS

| | | | |
|---|---|---|---|
| 3,365,592 | * | 1/1968 | Krautwald et al. ............. 310/331 |
| 3,614,485 | * | 10/1971 | Cosman et al. ................. 310/321 |
| 4,037,121 | * | 7/1977 | Nakamura et al. .............. 310/321 |
| 4,112,279 | * | 9/1978 | Brohard ......................... 200/181 |
| 4,742,260 | * | 5/1988 | Shimizu et al. ................ 310/323 |
| 4,812,698 | * | 3/1989 | Chida et al. ................... 310/330 |
| 5,034,649 | * | 7/1991 | Chida et al. ................... 310/332 |
| 5,276,672 | * | 1/1994 | Miyazaki et al. ............... 369/126 |
| 5,491,988 | * | 2/1996 | Hohne et al. ................... 310/331 |
| 5,600,137 | * | 2/1997 | Saito et al. .................... 250/306 |
| 5,689,380 | * | 11/1997 | Um ................................ 359/846 |
| 6,079,255 | * | 6/2000 | Binnig et al. ................... 73/105 |

* cited by examiner

Primary Examiner—Nestor Ramirez
Assistant Examiner—Peter Medley

(57) ABSTRACT

An electrically controlled actuator comprises at least two co-planar blades formed by a U-shaped pressing from a sheet of material. The end of one blade (60) is used as a mounting for the actuator and the end of the other blade (85) is used as an actuation surface. Piezo ceramic material is fixed to opposite surface of the two blades in order to flex the actuation surface with respect to the fixed surface. An electrically relay or residual current device incorporating such an actuator is disclosed.

14 Claims, 7 Drawing Sheets

LOW COMPONENT COUNT RELEASE MECHANISM

The use of piezo ceramic constructions is known for the production of sound and small, high precision motion. The limiting factor in broader applications is that the level of motion is generally smaller than most low and medium cost manufacturing tolerances can support. The use of precision machining then makes the devices prohibitively expensive and thus limited to higher value added uses.

The motion of piezo ceramic devices can be increased through the use of multiple layer structures, but there are significant efficiency losses between each layer and the gain in motion is disproportionately at the cost of force. For applications such as signalling and light reflection the use of very thin layers can create sizeable movement, but this approach is unacceptable for mechanisms which have to overcome friction and other forces, as the thin members distort under load and so lose their effect. The use of rigid amplifying links is not acceptable because the losses in the pivots are large compared to the initial movement of the bender component. The challenge therefore is to amplify motion without losing power and to combine the motion and release function with the minimum of pivots and associated linkages. Additionally, to offer commercially viable mechanisms the overall device must be compact and robust.

According to the present invention there is provided a two-bladed actuator constructed with two ceramic pieces to create a significant deflection of an operating face within a single layer ceramic and metal construction.

In order that the present invention be more readily understood, an embodiment thereof will now be described by way of example with reference to the accompanying drawings, in which.

Figure 1:
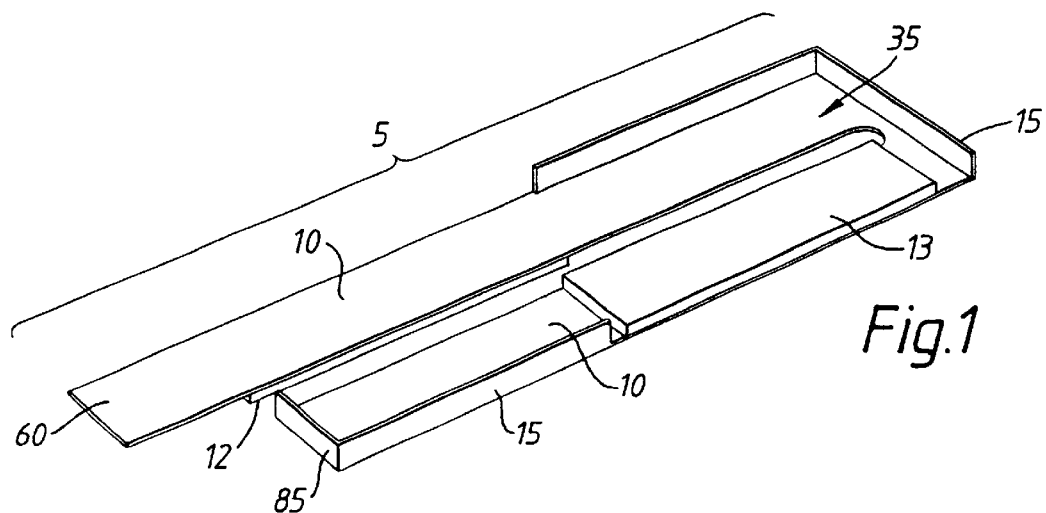
FIG. 1 shows a perspective view of an actuator according to the present invention.

Referring to FIG. 1, there is provided a generally planar actuating member (5), composed of two blades arranged in a U form. The blades of the actuator each comprise a flexing portion (10) and a rigid portion (15). The rigid portion can be made by altering the thickness of material, folding edges as shown or by the embossing of a stiffening profile, whichever is preferred. The flexing portions are shown parallel but may be angled to achieve other motions. To each flexing portion (10) is adhered by any suitable method a piece of piezo ceramic material (12, 13), connected to a suitable supply, which will typically be one capable of discharging a short pulse of a voltage just enough to cause the material to contract but not enough to cause the dielectric properties to be breached. In terms of current ceramic technology the maximum discharge voltage is between 500 and 1000 V per mm of material.

Piezo ceramic materials are given an electrical charge during manufacturing, a process called poling. As a result of this process the ovoid molecules of the material respond to an electrical field and align in one direction. Consequently the material dimension changes under the applied voltage from when no voltage is present and the molecules are randomly oriented. A substantially planar piece of material, having significantly greater length than width and greater width than depth will elongate under such conditions. By fixing planar portions of these materials to a stable base, such as a metal strip, the extension and contraction is converted into a curvature in exactly the same way as a thermostatic bi-metal whose use is well known. The ceramic is adhered to the obverse of the first flexing part (12) and to the reverse of the second flexing part (13) as in this way the flexing is cumulative.

In the embodiment shown the polarity of each piece is such that the same pole for each touches the blade, so that the blade when made from conducting material can act as one pole for the charging and discharging process. The outer faces of the slices are thus also the same polarity and can be electrically linked if desired. Through this arrangement the ceramic pieces will expand and contract together in proportion to the voltage across them and its polarity.

Figure 2A:
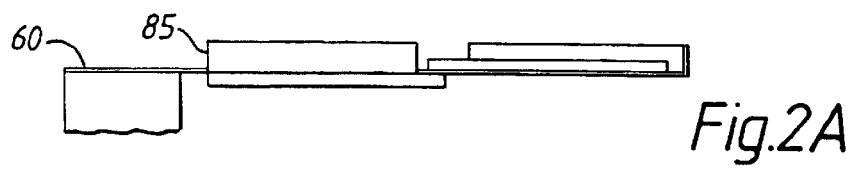
FIGS. 2A–2C show the actuator of FIG. 1 in different actuation conditions.
Figure 2B:
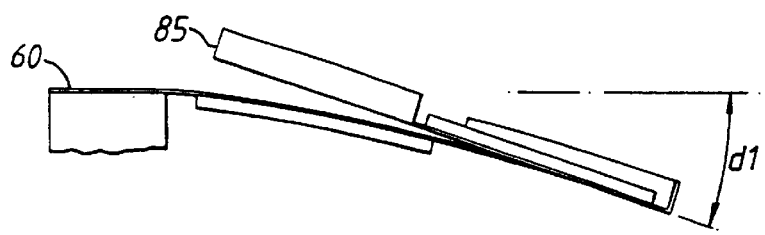
Figure 2C:
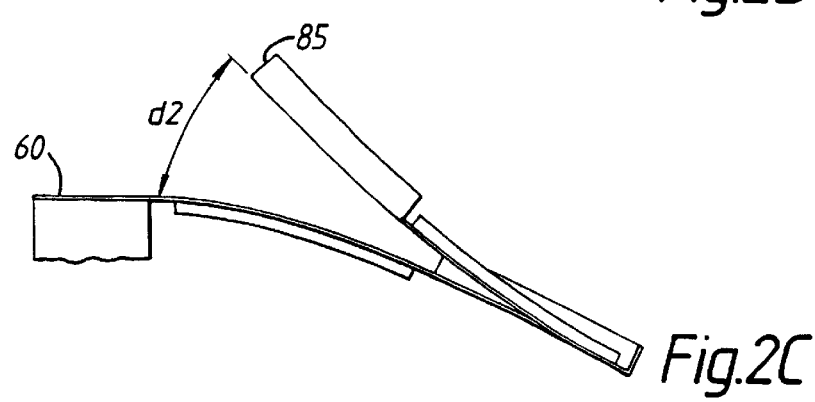

The flexing portion of the actuator operates as follows, with reference to FIG. 2A to 2C which are diagrammatic side views of the device shown in FIG. 1.

The actuator is fixed at the point (60) to a suitable immovable surface. In FIG. 2A the actuating portions are shown unenergised while in FIG. 2B voltage is applied to the first flexing member in order to cause it to curve under the contraction of the ceramic. The displacement at the end of the curving section is amplified by the rigid section to create an initial displacement (d1). Because the second flexing portion of the actuator is rigidly connected to the first by bight section (35), it assumes the same angle as the end of the beam of the first portion, such that the straight part is at a tangent to the radius of curvature. In FIG. 2C the same voltage is now applied to the second ceramic slice, causing this leg to also bend. Because the ceramic of the second leg is on the other side of the assembly the two distortions add, creating a final displacement (d2) of the free end (85) of the U which is double that of a single leg. Variations to the ratios of length can create different balances of force and displacement to suit specific applications.

The process described above creates not an absolute motion but a relative one, being a change in stiffness of the overall beam assembly. The start and end point of the free end (85) is thus dictated by the initial load in the plane of deflection. Changing the load will cause the beam to flex. In order to achieve consistency within manufacturing tolerances the actuator must be loaded perpendicular to the direction of deflection.

Figure 3A:
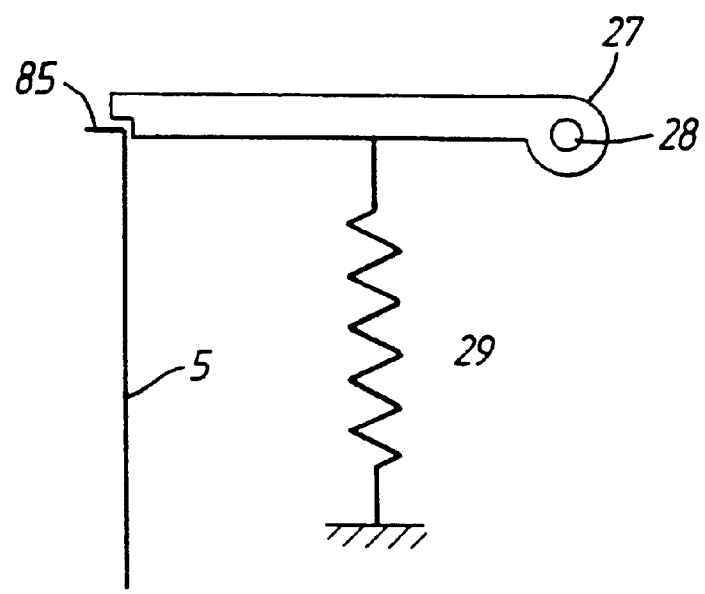
FIGS. 3A and 3B show basic diagrams for explaining a preferred use of the actuator of FIG. 1.
Figure 3B:
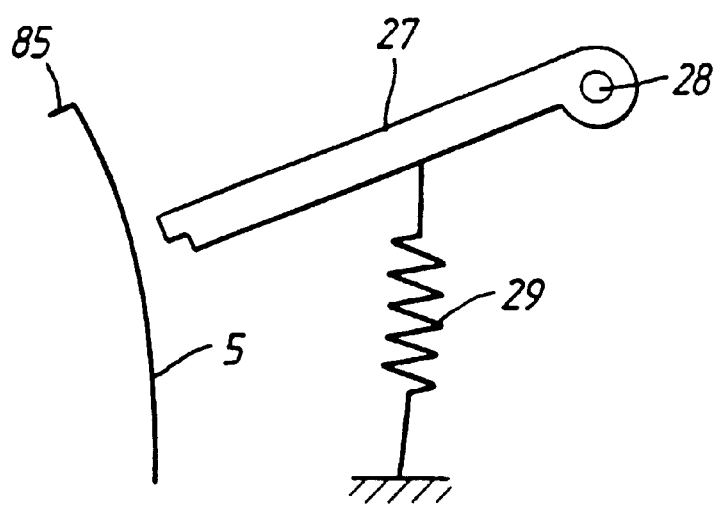

The simplest arrangement is as shown in FIGS. 3, 3A and 3B whereby there is a pivoting link (27) whose length is such that when the actuator (5) is in its unexcited state it forms a compressive member to create a simply supported beam, with a load (29) as shown in FIG. 3A. Upon excitation, the tip moves away from the end of the beam, allowing it to rotate about the pivot (28), as shown in FIG. 3B. This construction works, but has the disadvantage of being bulky, with the components being placed perpendicular to each other.

In order to reduce the overall volume of a mechanism a different arrangement is shown in FIGS. 4A to 4D. As shown in these figures, a sear (90) is provided. The sear (90) has an axle (71) made in any suitable way, a pawl tooth (73) which is concentric to the axle and a trigger face (74) which is also concentric to the axle.

The axle (71) is connected to a first sprung beam (30) which is biased to position A by a suitable energy source such as a spring (78) or inherent material flexion. We shall call position A OFF.

A second sprung beam (41) is provided having a stronger spring bias (42) than the first beam (30) operating in the opposite direction. If the two beams are pivotally joined by passing through the position shown in FIG. 4B, the resultant force of the springs would bring the pivoting beam (30) to position B shown in FIG. 4C, which we shall call ON. The second arm (41) has as part of its construction a detent tooth (75), positioned to pass beneath the pawl tooth (73) on the sear as seen in FIG. 4B.

A piezo ceramic actuator (5) such as the one shown in FIG. 1 is affixed to the second sprung beam (41) such that it is radial to the pivot of the second beam, tangential to the axis of the axle, with its free end (85) pointing away from the centre of rotation of the beam. In the configuration shown in FIG. 4C the detent tooth (75) is in front of the axle of the sear and the actuator tip is behind it such that the detent tooth imparts a rotation which exerts a compressive force onto the actuator tip. The construction of the actuator is such that this force is too small to deflect or buckle the actuator legs.

Figure 4A:
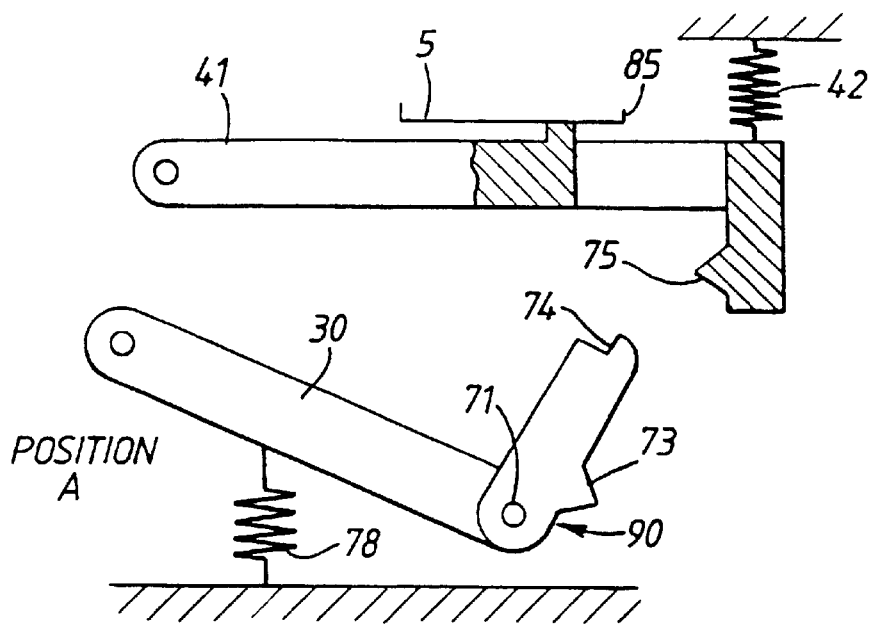
FIGS. 4A to 4D show diagrammatically the preferred use of the actuator of FIG. 1.

In FIG. 4A the pivoting beam is free from the arm (41) and is thus biased to the OFF position. The sear is biased by means of a spring to be broadly perpendicular to the pivoting beam. Alternatively, the sear can be provided with auxiliary camming faces which cause it to rotate into position as the condition in FIG. 4B is approached.

Figure 4B:
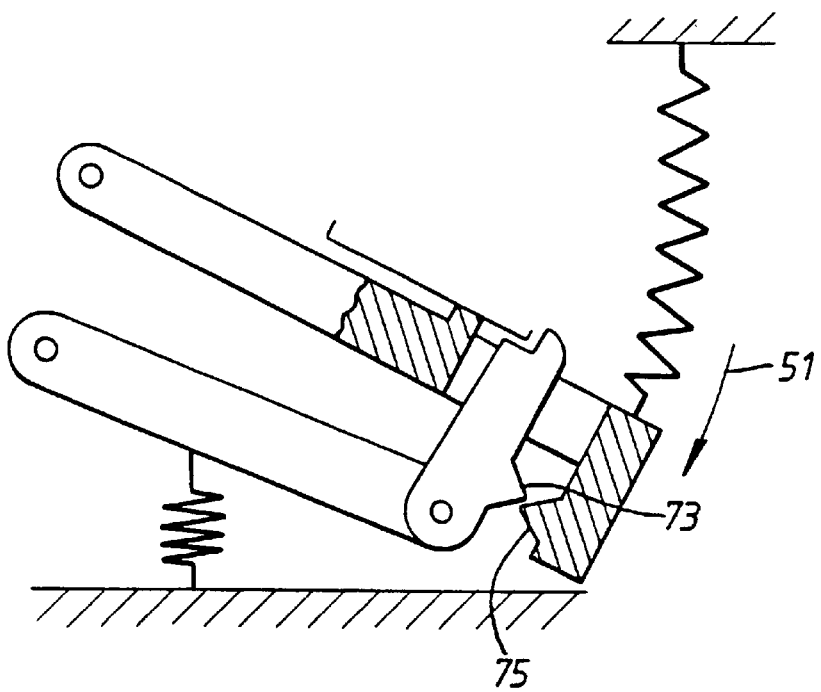
Figure 4C:
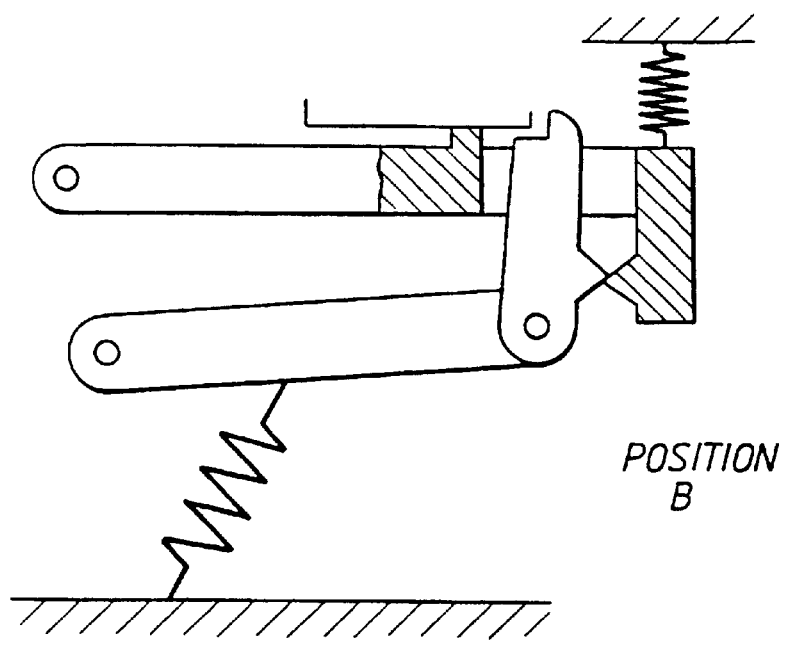

In FIG. 4B the second arm is pressed down in some conventional manner e.g. by a hand or other motive force (51) until the detent tooth (75) passes over the pawl tooth of the sear (73). The radial distance of the trigger face from the axle is greater than the radial distance from the sear axle to the tip of the actuator (85) at this position. Upon reaching the engagement point where the pawl tooth is fully passed by the detent tooth the sear rotates and the tip of the actuator falls against the trigger face 74, preventing its rotation to roll over the detent tooth on its upward path.

Upon release of the motive force used to bring the two arms into engagement the second arm's spring force draws both arms up in a parallelogram action, as the sear is unable to rotate due to the presence of the actuator against the trigger face. The first beam is now in the ON condition. This is shown as FIG. 4C.

Figure 4D:
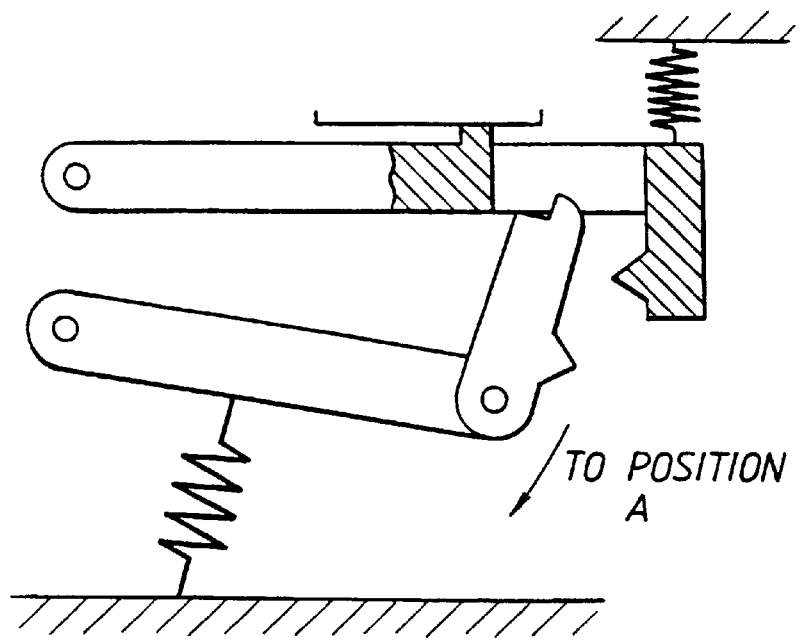

The mechanism is released in FIG. 4D by the distortion of the actuator 5 being sufficient cause the tip (85) of the actuator to clear the trigger face (74), allowing the sear pawl (73) to rotate away from the detent tooth (75) and the mechanism to collapse.

Figure 5A:
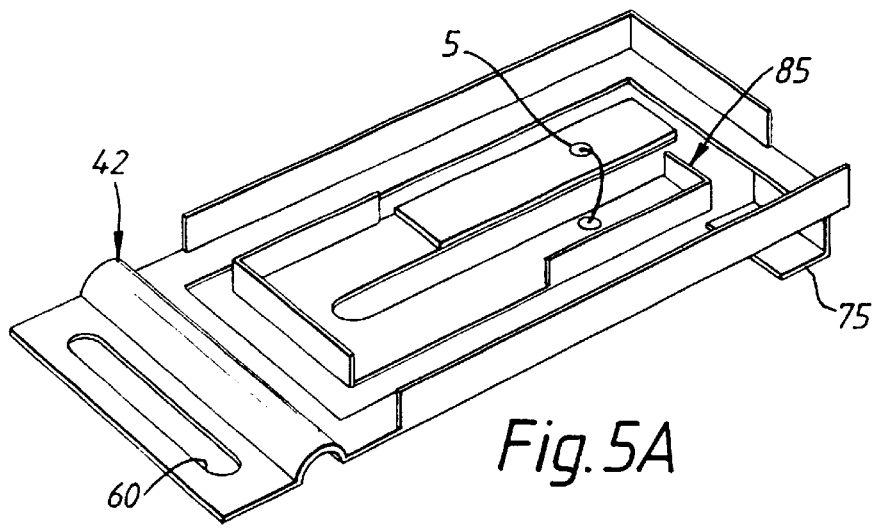
FIGS. 5A to 5C shows in perspective various components used in the embodiment of FIG. 4.
Figure 5B:
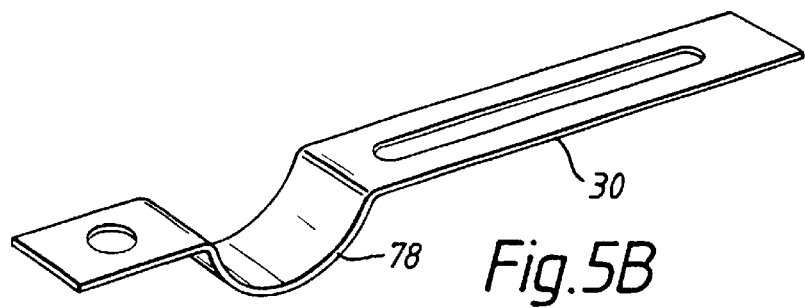

Although the diagrams show traditional pivot and rigid portions this is by way of illustration only. FIG. 5A shows how the actuator (5), release face (85), the "on" spring (42) and the detent tooth (75) can be formed from a single pressing of sheet metal, whilst FIG. 5B shows that the first beam (30) and its spring function (78) can be formed from another single component.

Figure 5C:
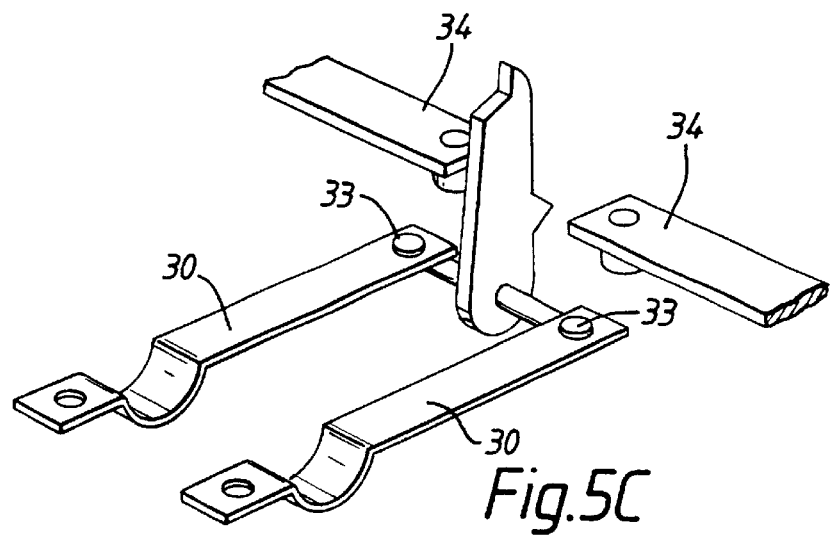

In the use of such a device for electrical protection purposes, the pivoting beam may be two single conducting beams linked by an insulating bridge to which the sear is connected, providing a convenient means of opening and closing the contacts, as shown in FIG. 5C, by having the moving contacts (33) on the first beam (30) and the fixed contacts (34) formed on a non-moving part as appropriate, including a circuit board or the moulding which carries the rigid parts for the mechanism itself.

By the introduction of a tangent angle to the interface between the piezo ceramic actuator (5) and the trigger face (85), it is possible to make the assembly inherently unstable, such that power must be applied to the piezo-ceramic components to stiffen the beam and allow the device to reset.

Figure 6:
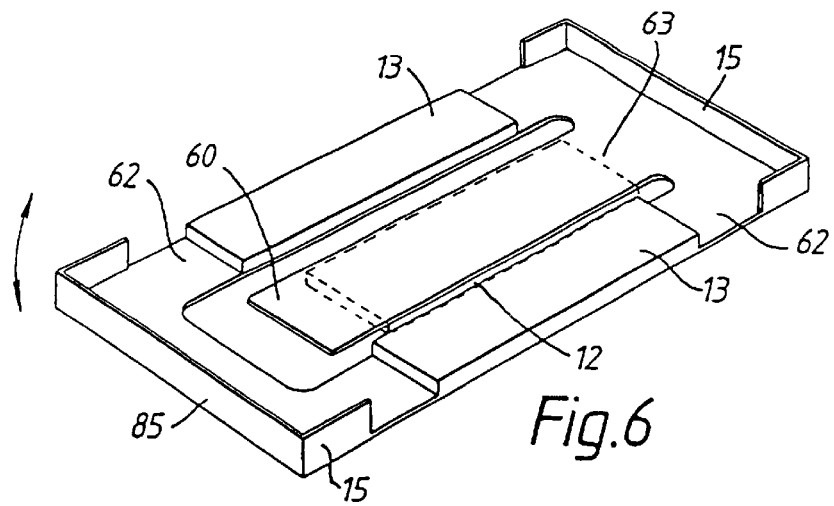
FIG. 6 shows a perspective view of another form of actuator according to the present invention.

The device shown in FIG. 1 can be made stiffer by increasing the number of prongs or legs as shown in FIG. 6.

As in the case of the device shown in FIG. 1, the actuator is formed as a pressing from sheet metal or similar stiff material. The same reference numerals are used to designate the same or similar parts in FIG. 1 and 6 and so a detailed description will not be given. Suffice to say that the end face 85 is formed as one end wall of a rectangular structure whose side walls are formed by two tongues 62 whose opposite end wall is strengthened as represented by the reference numeral 15 by the methods disclosed in relation to FIG. 1.

The end 60 of the central tongue 63 is fixed as before but in this case, the central tongue 63 is shorter than the tongues 62 forming the side walls. It will be noted that the piezo ceramic devices on the tongues 62 forming the side walls are on the same surface of the device whereas the piezo ceramic on the central tongue 63 is on the opposite side.

This construction is capable of bidirectional operation and has higher stiffness than the actuator shown in FIG. 1.

The actuator devices shown in FIGS. 1, 5 and 6 can be used in any suitable electromechanical device and some possible constructions of electromechanical device will now be described, it being assumed that a piezo-electric actuator device as shown in FIGS. 1, 5 or 6 as appropriate is incorporated.

Figure 7A:
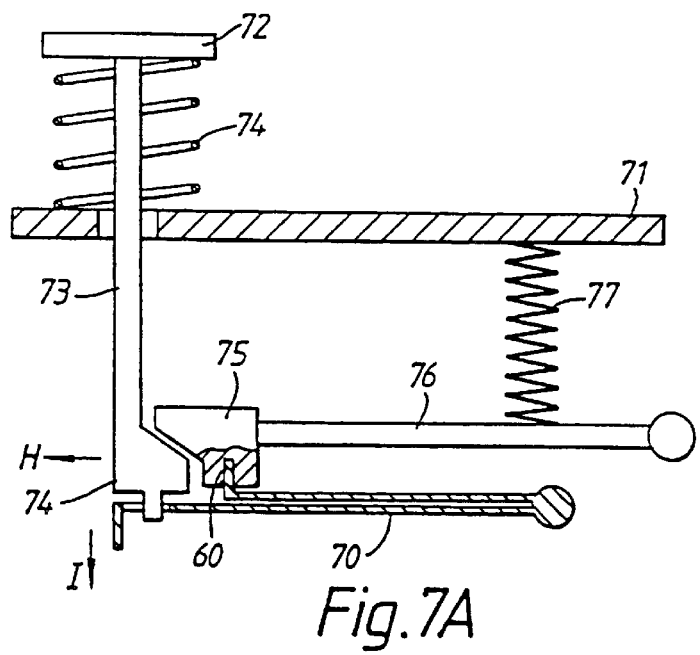
FIGS. 7A to 7B show one use of an actuator according to the present invention.
Figure 7B:
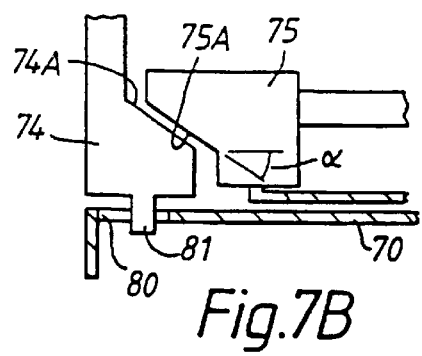

Referring firstly to FIGS. 7A and 7B, this shows diagrammatically the basic construction of a residual current device (RCD) otherwise known as a ground fault current indicator (GFCI). In this case, the piezo-electric actuator device is represented by the reference numeral 70.

The mechanism comprises a support surface 71 through which a setting part in the form of a push button 72 having a plunger 73 extends. The push button 72 is biassed upwardly by a spring 74.

The end of the plunger 72 is provided with a latching part 74 (shown in more detail in FIG. 7B) which engages a corresponding latching part 75 in the end of a rotatably mounted beam 76 which is biassed by a spring 77 away from the surface 71 in the opposite direction to the bias on the push button 72.

The piezo-electric actuator 70 is fixed to the latching part 75 and is disposed such that an aperture 80 (FIG. 7B) in the end 85 of the actuator is arranged to receive a projection 81 on the end of the latching part 74.

The latching parts 74 and 75 inter-engage by means of surfaces 74A and 75A and the interface angle a is such that a burst force H is created due to the springs 74 and 77. This force H is resisted by the actuator 70 acting on the pin 81 from the actuator 70, the end 85 of the actuator has to be moved in the direction of arrow I in FIG. 7A and this can be achieved by appropriate energisation or de-energisation of the piezo-ceramic actuator 70.

In the case of an RCD or relay, moveable contacts can be moved in response to the movement of the plunger 73 either by being directed attached to an extension of the plunger or indirectly through any suitable mechanism.

The spring 77 may be in the form of inherent resilience of the material used for the beam 76.

Figure 8:
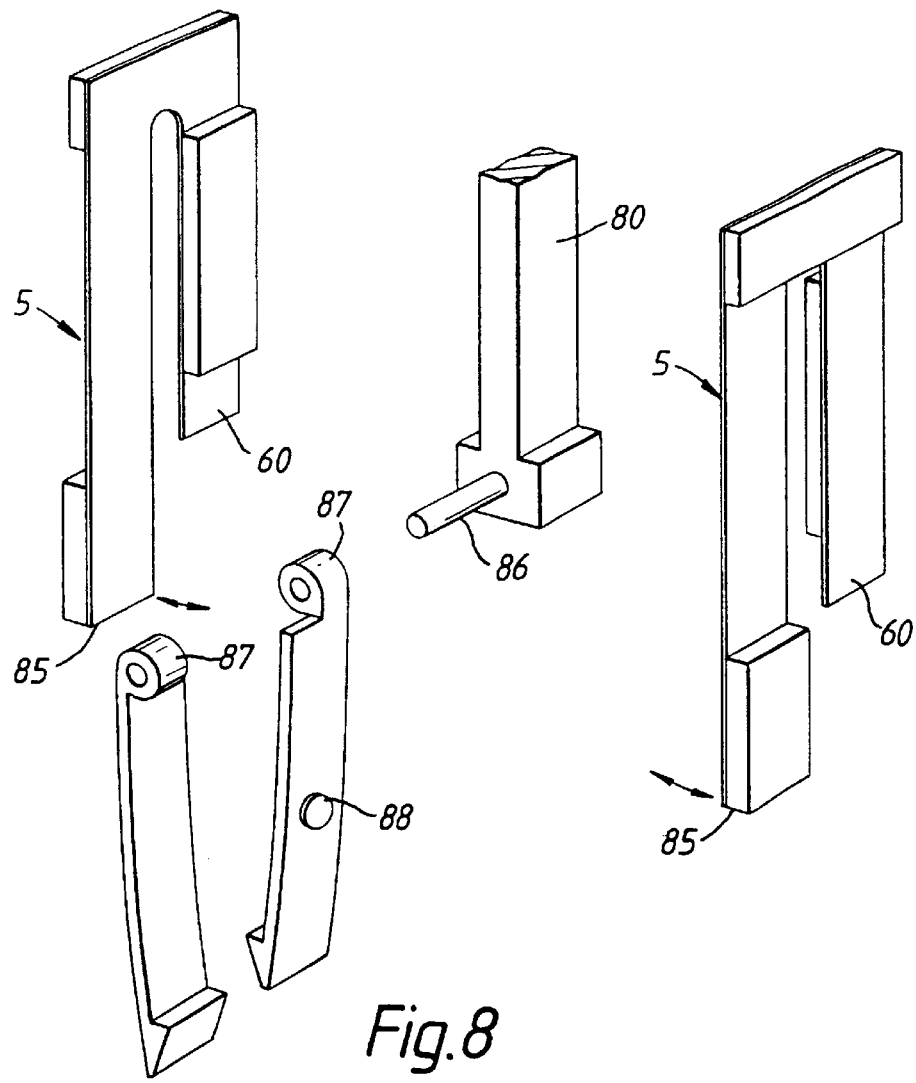
FIG. 8 shows one use for a plurality of actuators according to the present invention.

Another device utilizing the actuator shown in FIG. 1 is shown in FIG. 8. This shows how the movement of the end 85 of the actuator 5 could be mechanically amplified.

In this case, there are two actuators 5 fixed to a suitable support 80 and arranged to move their free ends 85 in opposite directions. A pivot 86 is provided on the support 80 and two arms 87 and mounted in the pivot 86. The arms have cam surfaces 88 which are arranged to engage with the free ends 85 of the actuator 5.

Simultaneous energisation of the actuators 5 will cause the arms to move towards each other with a gripping action. They can be returned to an open condition either by means of a bias provided by a spring force or by energisation of the actuators 5 in the opposite direction.

Figure 9:
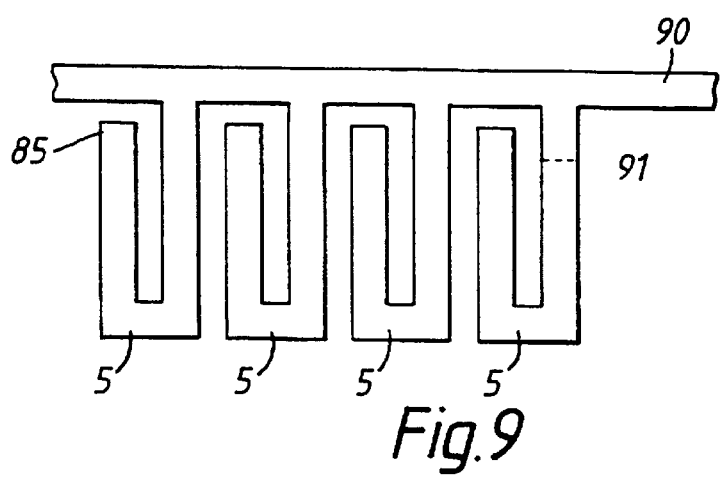
FIG. 9 shows a construction for a plurality of actuators according to the present invention.

The above construction of actuator is useful for providing a multiple output actuator device in a simple and cost effective manner as is exemplified by the arrangement shown in FIG. 9. In this embodiment a number of generally identical actuators are formed with their fixed ends 50 connected together along the length of a strip 90. The free end 85 of each actuator can thus be individually moved in and/or out of the plane of the plane of the paper.

The strip 90 is used to mount the actuator arrangement in any convenient manner depending upon the use to which the arrangement is to be put. For example, the strip 90 could be bent at a position on two fixed arms of the actuators as indicated by the dotted line 91 so that the ends of the actuators are in free space.

If two such arrangements are disposed opposite each other a multiple gripper similar to that shown in FIG. 8 could be formed.

It will be seen that the basic construction of actuator is capable of providing a large number of electrically controlled actuators of differing design for different purposes. Because the actuators are made from pressings of sheet material, different shapes of actuator can be formed or different combinations of actuators can be formed. For example two actuators could be formed in order to provide motion control in two directions

What is claimed is:

1. An electrically controlled actuator comprising a plurality of blades (10) each of which extends from a bight portion (35) to form a substantially U-shaped planar substrate (5) having opposed major surfaces, each blade being provided with a piezo-electric ceramic material (12,13) over part of its length with the ceramic material of one blade being on one major surface of the substrate, and the ceramic material of the other blade being on the other major surface of the substrate, the free end of one of the blades being arranged to form a mounting (60) for the actuator, with the free end of the other blade forming the activation portion (85) of the actuator.

2. An actuator according to claim 1, wherein the bight portion (35) is rigidified.

3. An actuator according to claim 1, wherein the actuation portion (85) is rigidified.

4. An actuator according to claim 3, wherein the rigidification is achieved by bending portions of the planar substrate.

5. An actuator according to claim 1, wherein the planar substrate is generally rectangular and in the form of a frame enclosing a central elongated tongue (53) which extends from one end of the rectangular frame.

6. An actuator according to claim 5, wherein the free end of the central tongue (63) forms the mounting for the actuator.

7. An actuator according to claim 6, wherein the ends of the frame are rigidified.

8. An actuator arrangement, wherein a plurality of actuators according to claim 1, have their respective mounting portions (60) connected to a common rail (90) forming a mount for all the substrates.

9. An actuator arrangement according to claim 8, wherein the blades connected to the common rail (90) are bent at a position spaced from the junction between the blades and the rail whereby the actuation portions of the individual actuator elements are in free space.

10. An electrically controlled device including an electrically controlled actuator or actuator device according to claim 1.

11. A device according to claim 10, wherein a latching mechanism is retained in a latched condition using the actuator.

12. A device according to claim 10, wherein the movement of the actuation portion (85) of the actuator is mechanically amplified by means of one or more lever elements.

13. A device according to claim 12, wherein two actuators are provided, operating in opposite directions to each other.

14. A device according to claim 13, wherein each of the actuators contacts a respective lever element to form a gripping device.

* * * * *